(12) United States Patent
Lubinsky et al.

(10) Patent No.: US 12,025,757 B2
(45) Date of Patent: Jul. 2, 2024

(54) DUAL-SCREEN DIGITAL RADIOGRAPHY WITH ASYMMETRIC REFLECTIVE SCREENS

(71) Applicant: The Research Foundation for The State University of New York, Albany, NY (US)

(72) Inventors: Anthony Lubinsky, Port Jefferson Station, NY (US); Wei Zhao, East Setauket, NY (US); John A. Rowlands, Thunder Bay (CA); Adrian Howansky, Centereach, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 0 days.

(21) Appl. No.: 17/893,609

(22) Filed: Aug. 23, 2022

(65) Prior Publication Data

US 2022/0404513 A1 Dec. 22, 2022

Related U.S. Application Data

(63) Continuation of application No. 16/780,126, filed on Feb. 3, 2020, now Pat. No. 11,460,590, which is a
(Continued)

(51) Int. Cl.
*G01T 1/20* (2006.01)
*G21K 4/00* (2006.01)
*H01L 27/146* (2006.01)

(52) U.S. Cl.
CPC ........ *G01T 1/2006* (2013.01); *G01T 1/20183* (2020.05); *H01L 27/14663* (2013.01); *G21K 4/00* (2013.01)

(58) Field of Classification Search
CPC . G01T 1/2006; G01T 1/2018; G01T 1/20181; G01T 1/2008; G01T 1/20183;
(Continued)

(56) References Cited

U.S. PATENT DOCUMENTS 3,971,932 A 7/1976 Sewell et al.
4,429,227 A 1/1984 DiBianca et al.
(Continued)

FOREIGN PATENT DOCUMENTS

CN 101506905 A 8/2009
CN 107914358 B 4/2021
(Continued)

OTHER PUBLICATIONS

US 10,473,799 B2, 11/2019, Nelson et al. (withdrawn)
(Continued)

*Primary Examiner* — Dani Fox
*Assistant Examiner* — Soorena Kefayati
(74) *Attorney, Agent, or Firm* — Scully, Scott, Murphy & Presser, P.C.

(57) ABSTRACT

Structures operable to detect radiation are described. The structure may two screens with a phosphor layer, respective. The structure may further include a photosensor array disposed between the first screen and the second screen such that the photosensor array directly contacts the first screen or is directly attached to the first screen using an optical adhesive and directly contacts the second screen or is directly attached to the second screen using an optical adhesive.

20 Claims, 12 Drawing Sheets

Related U.S. Application Data continuation-in-part of application No. PCT/US2018/044924, filed on Aug. 2, 2018.

(60) Provisional application No. 62/711,883, filed on Jul. 30, 2018, provisional application No. 62/540,620, filed on Aug. 3, 2017.

(58) Field of Classification Search
CPC ..... G01T 1/20185; G01T 1/2012; G01T 1/20; G01T 1/20184; G01T 1/20002; G21K 4/00; G21K 2004/06; G21K 2004/08; H01L 27/14663; H01L 27/14603; H01L 27/14689; H01L 27/146; H01L 27/14609; H01L 27/14658
See application file for complete search history.

(56) References Cited

U.S. PATENT DOCUMENTS

| | | |
|---|---|---|
| 4,437,007 A | 3/1984 | Koslow et al. |
| 4,513,078 A * | 4/1985 | Sandrik .............. G21K 4/00 378/174 |
| 4,710,637 A * | 12/1987 | Luckey .............. G01T 1/1641 250/486.1 |
| 4,946,238 A | 8/1990 | Sashin et al. |
| 5,017,782 A | 5/1991 | Nelson |
| 5,198,673 A | 3/1993 | Rougeot et al. |
| 5,430,298 A | 7/1995 | Possin et al. |
| 5,514,874 A * | 5/1996 | Boone .............. G21K 4/00 250/487.1 |
| 5,594,253 A | 1/1997 | Bueno et al. |
| 5,600,144 A | 2/1997 | Worstell |
| 5,636,299 A | 6/1997 | Bueno et al. |
| 5,712,483 A | 1/1998 | Boone et al. |
| 5,864,146 A | 1/1999 | Karellas |
| 6,031,234 A | 2/2000 | Albagli et al. |
| 6,167,110 A | 12/2000 | Possin et al. |
| 6,172,371 B1 | 1/2001 | DeJule et al. |
| 6,384,400 B1 | 5/2002 | Albagli et al. |
| 6,396,046 B1 | 5/2002 | Possin et al. |
| 6,442,237 B1 | 8/2002 | Corby, Jr. et al. |
| 6,541,774 B1 | 4/2003 | DeJule et al. |
| 6,566,809 B1 | 5/2003 | Fuchs et al. |
| 6,717,174 B2 | 4/2004 | Karellas |
| 6,920,238 B1 | 7/2005 | Chen et al. |
| 7,035,372 B2 | 4/2006 | Chen |
| 7,078,702 B2 | 7/2006 | Ringermacher et al. |
| 7,105,826 B2 | 9/2006 | Ren et al. |
| 7,115,876 B2 | 10/2006 | Ren et al. |
| 7,122,804 B2 | 10/2006 | Mollov |
| 7,304,309 B2 | 12/2007 | Suhami |
| 7,522,786 B2 | 4/2009 | Kiesel et al. |
| 7,569,832 B2 | 8/2009 | Tredwell et al. |
| 7,834,321 B2 | 11/2010 | Yorkston et al. |
| 7,956,332 B2 | 6/2011 | Burr et al. |
| 8,106,363 B2 | 1/2012 | Yip |
| 8,294,112 B2 | 10/2012 | Levene et al. |
| 8,330,115 B2 | 12/2012 | Frank |
| 8,492,728 B2 | 7/2013 | Antonuk |
| 8,558,185 B2 | 10/2013 | Tredwell |
| 8,569,704 B2 | 10/2013 | Tredwell |
| 8,692,176 B2 | 4/2014 | Kelly et al. |
| 8,729,478 B2 | 5/2014 | Tredwell et al. |
| 8,748,824 B2 | 6/2014 | Kusner |
| 8,772,728 B2 * | 7/2014 | Tredwell .............. G01T 1/20183 250/370.01 |
| 8,774,353 B2 * | 7/2014 | Herrmann .............. G01T 1/247 378/19 |
| 8,791,537 B2 * | 7/2014 | Chan .............. H01L 31/02322 257/436 |
| 9,012,857 B2 * | 4/2015 | Levene .............. G01T 1/362 378/19 |
| 9,069,084 B2 * | 6/2015 | Frank .............. G01T 1/201 |
| 9,075,150 B2 * | 7/2015 | Tredwell .............. G01T 1/20183 |
| 9,121,950 B2 | 9/2015 | Luhta et al. |
| 9,140,808 B2 | 9/2015 | Ronda et al. |
| 9,194,960 B2 | 11/2015 | Gagnon et al. |
| 9,324,469 B1 | 4/2016 | Hamilton |
| 9,348,034 B2 | 5/2016 | Tredwell et al. |
| 9,395,451 B2 | 7/2016 | Menge |
| 9,712,771 B2 | 7/2017 | Kelly et al. |
| 9,770,603 B2 | 9/2017 | Da Silva Rodrigues et al. |
| 9,864,070 B2 | 1/2018 | Suponnikov et al. |
| 9,995,830 B2 | 6/2018 | Schulz |
| 10,228,471 B2 | 3/2019 | Benlloch Baviera et al. |
| 10,288,748 B2 | 5/2019 | Vogtmeier et al. |
| 10,310,104 B1 | 6/2019 | Nisius et al. |
| 10,365,383 B2 | 7/2019 | Nelson et al. |
| 10,371,830 B2 * | 8/2019 | Jacobs .............. G01T 1/20186 |
| 10,527,739 B2 | 1/2020 | Chappo et al. |
| 10,598,802 B2 | 3/2020 | Luhta et al. |
| 10,884,141 B2 | 1/2021 | Nelson et al. |
| 2002/0070365 A1 | 6/2002 | Karellas |
| 2003/0020019 A1 | 1/2003 | Wischmann et al. |
| 2004/0105524 A1 | 6/2004 | Ren et al. |
| 2004/0114711 A1 | 6/2004 | Ren et al. |
| 2004/0227091 A1 | 11/2004 | LeBlanc et al. |
| 2005/0199819 A1 | 9/2005 | Wieczorek |
| 2005/0285044 A1 | 12/2005 | Mollov |
| 2006/0067472 A1 | 3/2006 | Possin et al. |
| 2006/0131509 A1 | 6/2006 | Matz et al. |
| 2006/0151708 A1 | 7/2006 | Bani-Hashemi et al. |
| 2006/0202125 A1 | 9/2006 | Suhami |
| 2007/0146888 A1 | 6/2007 | Schmidt et al. |
| 2007/0147726 A1 | 6/2007 | Kiesel et al. |
| 2007/0148760 A1 | 6/2007 | Klesel et al. |
| 2008/0011960 A1 * | 1/2008 | Yorkston .............. G01T 1/20181 250/370.09 |
| 2008/0128631 A1 | 6/2008 | Suhami |
| 2008/0210877 A1 | 9/2008 | Altman et al. |
| 2008/0245968 A1 * | 10/2008 | Tredwell .............. G01T 1/20183 250/370.09 |
| 2009/0014662 A1 | 1/2009 | Suhami |
| 2009/0020705 A1 | 1/2009 | Pandelisev |
| 2009/0166546 A1 | 7/2009 | Fleischmann et al. |
| 2009/0220189 A1 | 9/2009 | Kiesel et al. |
| 2009/0261259 A1 | 10/2009 | Yip |
| 2010/0032578 A1 | 2/2010 | Levene et al. |
| 2010/0054418 A1 | 3/2010 | Okada et al. |
| 2010/0072383 A1 | 3/2010 | Okada |
| 2010/0102242 A1 | 4/2010 | Burr et al. |
| 2010/0224783 A1 | 9/2010 | Frank |
| 2010/0264322 A1 | 10/2010 | Levene et al. |
| 2010/0276600 A1 | 11/2010 | Ronda et al. |
| 2011/0303849 A1 * | 12/2011 | Tredwell .............. G01T 1/20184 250/362 |
| 2012/0091350 A1 | 4/2012 | Gagnon et al. |
| 2012/0153174 A1 | 6/2012 | Tredwell |
| 2012/0153175 A1 | 6/2012 | Tredwell |
| 2012/0168633 A1 * | 7/2012 | Tredwell .............. G01T 1/20183 250/371 |
| 2012/0205544 A1 * | 8/2012 | Nakatsugawa ... H01L 27/14663 257/E31.129 |
| 2013/0082184 A1 * | 4/2013 | Nakatsugawa ...... A61B 6/4266 250/361 R |
| 2013/0082264 A1 * | 4/2013 | Couture .............. G01T 1/2018 257/E29.273 |
| 2013/0126753 A1 * | 5/2013 | Aylward .............. B32B 37/1284 156/60 |
| 2013/0221229 A1 * | 8/2013 | Jagannathan ......... G01T 1/2006 250/361 R |
| 2013/0256538 A1 * | 10/2013 | Vogtmeier ............. G01T 1/2008 250/366 |
| 2013/0327945 A1 * | 12/2013 | Shibutani .............. G01T 1/2006 250/361 R |
| 2014/0113130 A1 * | 4/2014 | Jagannathan ............. G21K 4/00 428/354 |
| 2014/0264043 A1 | 9/2014 | Ganguly et al. |
| 2014/0353513 A1 * | 12/2014 | Partain ..................... G01T 1/20 250/366 |
| 2015/0123119 A1 | 5/2015 | Sekine et al. |
| 2015/0144796 A1 | 5/2015 | Tredwell |

(56) References Cited

U.S. PATENT DOCUMENTS

| | | | |
|---|---|---|---|
| 2015/0185334 A1 | 7/2015 | Tredwell et al. | |
| 2015/0260853 A1* | 9/2015 | Tredwell | G01T 1/20183 |
| | | | 438/66 |
| 2016/0148980 A1 | 5/2016 | Liu et al. | |
| 2016/0322411 A1* | 11/2016 | Elen | H01L 27/14623 |
| 2016/0322418 A1* | 11/2016 | Leblans | H01L 27/14685 |
| 2017/0205516 A1* | 7/2017 | Yamakawa | H01L 27/146 |
| 2017/0285184 A1* | 10/2017 | Yoshida | G01T 1/2002 |
| 2017/0307767 A1* | 10/2017 | Zyazin | G01T 1/2002 |
| 2017/0371043 A1 | 12/2017 | Schulz | |
| 2018/0100937 A1 | 4/2018 | Luhta et al. | |
| 2019/0056515 A1* | 2/2019 | Kobayashi | G01T 1/20 |
| 2019/0324159 A1 | 10/2019 | Inoue et al. | |
| 2019/0353802 A1* | 11/2019 | Steinhauser | H01L 27/14621 |
| 2020/0041667 A1 | 2/2020 | Chappo | |
| 2023/0058622 A1 | 2/2023 | Lubinsky et al. | |

FOREIGN PATENT DOCUMENTS

| | | |
|---|---|---|
| CN | 112713163 A | 4/2021 |
| CN | 107495980 B | 8/2021 |
| CN | 113795773 A | 12/2021 |
| CN | 107661114 B | 1/2022 |
| DE | 2553564 A1 | 8/1976 |
| DE | 10013168 A1 | 4/2001 |
| DE | 10333821 A1 | 2/2004 |
| DE | 69630240 T2 | 8/2004 |
| DE | 69836190 T2 | 8/2007 |
| DE | 69935199 T2 | 11/2007 |
| DE | 60033913 T2 | 12/2007 |
| DE | 112015006716 T5 | 4/2018 |
| EP | 1113290 A2 | 7/2001 |
| EP | 1113920 A2 | 7/2001 |
| EP | 0900392 B1 | 10/2003 |
| EP | 0957766 B1 | 9/2005 |
| EP | 2110685 A2 | 10/2009 |
| EP | 1520186 B1 | 1/2010 |
| EP | 2378525 A2 | 10/2011 |
| EP | 2802898 B1 | 3/2018 |
| EP | 2847619 B1 | 9/2018 |
| EP | 3438699 A1 | 2/2019 |
| EP | 3450915 A1 | 3/2019 |
| EP | 3451021 A1 | 3/2019 |
| EP | 3356859 B1 | 6/2023 |
| JP | H06140614 A | 5/1994 |
| JP | H06-201457 A | 7/1994 |
| JP | H08211518 A | 8/1996 |
| JP | H08-289883 A | 11/1996 |
| JP | H10-300858 A | 11/1998 |
| JP | H11-202053 A | 7/1999 |
| JP | 2001135267 A | 5/2001 |
| JP | 2001215280 A | 8/2001 |
| JP | 2002-168955 A | 6/2002 |
| JP | 2006177940 A | 7/2006 |
| JP | 2007171177 A | 7/2007 |
| JP | 4063324 B2 | 3/2008 |
| JP | 2012-088302 A | 5/2012 |
| JP | 2012-168009 A | 9/2012 |
| JP | 2014510902 A | 5/2014 |
| JP | 2014514554 A | 6/2014 |
| JP | 2014-222237 A | 11/2014 |
| JP | 2015-521283 A | 7/2015 |
| JP | 5925452 B2 | 5/2016 |
| JP | 2016217875 A | 12/2016 |
| JP | 2017501388 A | 1/2017 |
| JP | 2019-028057 A | 2/2019 |
| JP | 6574419 B2 | 9/2019 |
| JP | 6670307 B2 | 3/2020 |
| JP | 2020-510820 A | 4/2020 |
| JP | 2021-533356 A | 12/2021 |
| KR | 20090031728 A | 3/2009 |
| KR | 20150114570 A | 10/2015 |
| KR | 101683873 B1 | 12/2016 |
| KR | 101819757 B1 | 1/2018 |
| RU | 2589252 C2 | 7/2016 |
| TW | I464442 B | 12/2014 |
| TW | I470262 B | 1/2015 |
| WO | 1997042877 A1 | 11/1997 |
| WO | 2005103759 A1 | 11/2005 |
| WO | 2007036463 A1 | 4/2007 |
| WO | 2007098493 A2 | 8/2007 |
| WO | 2007120674 A2 | 10/2007 |
| WO | 2009031074 A2 | 3/2009 |
| WO | 2009060349 A2 | 5/2009 |
| WO | 2009072056 A2 | 6/2009 |
| WO | 2009083852 A2 | 7/2009 |
| WO | 2010141125 A2 | 12/2010 |
| WO | 2012104798 A2 | 8/2012 |
| WO | 2013077979 A1 | 5/2013 |
| WO | 2015028042 A1 | 3/2015 |
| WO | 2017059086 A1 | 4/2017 |
| WO | 2017067846 A1 | 4/2017 |
| WO | 2019041172 A1 | 3/2019 |
| WO | 2019226859 A1 | 11/2019 |
| WO | 2020013689 A1 | 1/2020 |
| WO | 2020131754 A1 | 6/2020 |
| WO | 2020204747 A1 | 10/2020 |
| WO | 2021151017 A1 | 7/2021 |
| WO | 2021158587 A1 | 8/2021 |

OTHER PUBLICATIONS

US 10,473,800 B2, 11/2019, Nelson et al. (withdrawn)
Decision of Rejection dated Oct. 18, 2022 received in Japanese Patent Application No. JP 2020-505821.
Lubinsky A.R. et al., "Dual Screen Sandwhich Configurations for Digital Radiography", Proc. of SPIE 10573:105735U-1-105735U-11 (Mar. 2018).
International Search Report dated Oct. 24, 2018 received in International Application No. PCT/US2018/044924.
International Search Report dated Aug. 15, 2019 received in International Application No. PCT/US2019/033683.
International Search Report and Written Opinion dated Mar. 18, 2021 received in International Application No. PCT/US2021/016297.
Office Action dated Dec. 24, 2020 received in U.S. Appl. No. 16/780,126.
Office Action dated Apr. 27, 2021 received in U.S. Appl. No. 16/780,126.
Office Action dated Aug. 30, 2021 received in U.S. Appl. No. 16/780,126.
Notice of Allowance dated Feb. 3, 2022 received in U.S. Appl. No. 16/780,126.
Notice of Allowance dated May 12, 2022 received in U.S. Appl. No. 16/780,126.
Office Action dated May 17, 2022 received in Japanese Patent Application No. JP 2020-505821 together with an English language translation.
Notice of Office Action dated Jul. 3, 2023 received in Korean Patent Application No. KR 10-2020-7006326.
Notice of Rejection dated Dec. 12, 2023 received in Japanese Patent Application No. 2023-023264.
Office Action dated Apr. 9, 2024 received in Japanese Patent Application No. JP 2023-023264.

* cited by examiner

DUAL-SCREEN DIGITAL RADIOGRAPHY WITH ASYMMETRIC REFLECTIVE SCREENS

CROSS REFERENCE TO RELATED APPLICATIONS

This application is a continuation of U.S. patent application Ser. No. 16/780,126 filed on Feb. 3, 2020, which is a continuation-in part of PCT Application No. PCT/US2008/044924 filed on Aug. 2, 2018, which claims the benefit of U.S. Provisional Application No. 62/540,620 filed on Aug. 3, 2017, and U.S. Provisional Application No. 62/711,883 filed on Jul. 30, 2018, the entirety of which are incorporated by reference.

FIELD

The present application relates generally to radiation detectors and digital radiography and imaging systems.

BACKGROUND

In digital radiography, an imaging system may include a screen, such as Flat Panel Detector (FPD) that absorbs radiation and produces pulses of visible light upon x-ray absorption, where the produced light is sensed by an array of photosensors to generate electrical signals. The generated electrical signals may be used by the imaging system to produce a digital image. In some examples, a quality (e.g., sharpness, resolution) of the produced image may be affected by various phenomenons such as light scattering, and/or other phenomena.

For example, "Indirect" FPDs form x-ray images by detecting the incoming spatial distribution of x-rays with a scintillating screen, e.g., x-ray conversion layer combined with a 2D photosensor array. Known FPD may use a single screen in either a front illuminated (FI) Mode in which the incoming x-rays pass first through the scintillating screen or in a back illuminated (BI) mode, in which the x-rays pass first through the photosensor array. However, a large fraction of the incident x-ray beam passes through the screen undetected. Increasing the thickness of the single scintillating layer is not a viable solution because the image quality would then suffer from excessive spatial blur.

A "screen" is a radiation converter which typically produces visible light pulses, and which typically has "gain", i.e. one higher energy quantum may produce many light pulses.

While the use of two screens, e.g., a front screen and back screen, sandwiched around an array have been described in documents, the inventors are not aware of any commercial structures, and particular structures for x-ray imaging having this configuration.

SUMMARY

Accordingly, disclosed are structures, imaging systems and detectors that provide improved image quality and dose performance. For example, a structure may comprise two screens (scintillating screens). A photosensor array is between the two screens. The first scintillating screen may convert an absorbed portion of incident radiation directed at the structure into light photons. The second scintillating screen may convert an absorbed portion of the incident radiation transmitted through the first scintillating screen and the photosensor array into light photons. A surface of the first scintillating screen may face the photosensor array and a surface of the second scintillating screen may face the photosensor array. The photosensor array may capture at least a portion of the light photons from the first scintillating screen and the second scintillating screen and convert the captured light photons into electrical signals. The photosensor array may directly contact the first scintillating screen or may be directly attached to the first scintillating screen using an optical adhesive. Additionally, the photosensor array may directly contact the second scintillating screen or may be directly attached to the second scintillating screen using an optical adhesive.

In some aspects, the photosensor array may comprise a plurality of bidirectionally photosensitive storage elements for capturing the at least a portion of the light photons from the first scintillating screen and the second scintillating screen, switching elements where one switching element of the plurality of switching elements corresponds to one of the plurality of photosensitive storage elements, respectively, a transparent metal bias layer and a transparent 2D patterned metal layer. The transparent 2D patterned metal layer may face the second scintillating screen.

In some aspects, one or both the transparent metal bias layer and the transparent 2D patterned metal layer may comprise an optical filter. For example, the transparent 2D patterned metal layer may comprise an optical filter configured to attenuate light output from the second scintillating screen. Additionally, or alternatively, the transparent metal bias layer may comprise an optical filter configured to attenuate light output from the first scintillating screen.

In some aspects, the optical filter may have an optical density between about 0.0 and about 0.3.

In some aspects, the optical filter may be a layer of absorbing material.

In some aspects, the thickness of the scintillating screens may be different. For example, the first scintillating screen may comprise a scintillating structure having a first thickness, and the second scintillating screen may comprise a scintillating structure having a second thickness, where the second thickness is greater than the first thickness.

In some aspects, a ratio of the first thickness and a combination of the first thickness and the second thickness may be based on the incoming x-ray beam energy. In other aspects, the ratio may be based on target parameters such as target spatial resolution performance or a target detective quantum efficiency.

In some aspects, the ratio may be between about 0.2 and about 0.4. In other aspects, the ratio may be between about 0.25 and about 0.45.

In some aspects, one or both screens may have a backing. The backing may be reflective.

In some aspects, the screens may be formed of different types. The types may be powder or granular, needle structured (columnar) or perovskite.

Also disclosed is a structure comprises two screens, a photosensor array and a fiber optic plate (FOP). The FOP may be between the photosensor array and the second scintillating screen. The photosensor array may be between the first scintillating screen and the fiber optic plate. The first scintillating screen may convert an absorbed portion of incident radiation directed at the structure into light photons. The second scintillating screen may convert an absorbed portion of the incident radiation transmitted through the first scintillating screen, the photosensor array and the fiber optic plate, into light photons. A surface of the first scintillating screen may face the photosensor array and a surface of the second scintillating screen may face the fiber optic plate.

The photosensor array may capture at least a portion of the light photons from the first scintillating screen and the second scintillating screen and convert the captured light photons into electrical signals. The fiber optic plate may be a substrate for the photosensor array.

In some aspects, the photosensor array may comprise a plurality of bidirectionally photosensitive storage elements for capturing the at least a portion of the light photons from the first scintillating screen and the second scintillating screen, switching elements where one switching element of the plurality of switching elements corresponds to one of the plurality of photosensitive storage elements, respectively, a transparent metal bias layer and a transparent 2D patterned metal layer. The transparent 2D patterned metal layer may face the fiber optic plate.

One or both of the transparent 2D patterned metal layer and the transparent metal bias layer comprises an optical filter.

Also disclosed is an imaging system having one of the above structures. The system comprises a processor in communication with one of the above structures. The processor may receive the electrical signals from the structure; and produce the image having the plurality of pixels using the electrical signals.

In some aspects, the processor may control each row of switching elements using a scanning control unit, thereby connecting the corresponding photosensitive storage elements to amplifiers, whose outputs are digitized to pixel values for each row of the image.

Also disclosed is a radiation detector comprising one of the above structures.

Further features as well as the structure and operation of various embodiments are described in detail below with reference to the accompanying drawings. In the drawings, like reference numbers indicate identical or functionally similar elements.

DETAILED DESCRIPTION

The following detailed description of aspect of the disclosure will be made in reference to the accompanying drawings. In this disclosure, explanation about related functions or constructions known in the art are omitted for the sake of clearness in understanding the concept of the disclosure to avoid obscuring the disclosure with unnecessary detail.

Active-matrix indirect flat-panel imagers (AMFPI) may be used in applications of digital radiography. In some examples, AMFPI's may include a single intensifying screen (such as a FPD), and may be fabricated by placing a sensor array (e.g., thin film transistor array) below the intensifying screen such that the AMFPI may be operated by having x-rays incident from above the intensifying screen. A thickness of the single intensifying screen may be based on a tradeoff between x-ray absorption and spatial resolution. For example, increasing thickness may improve absorption and sensitivity, but may also decrease resolution due to light scattering in a phosphor layer of the intensifying screen.

In screen-film radiography, a dual-screen system may include a dual-emulsion film disposed between two partitions (screens) divided from a single intensifying screen. Such a configuration may reduce light scattering due to the reduced distance between the incident radiation and the film, but may invoke the crossover phenomenon, where light photons may penetrate through the film emulsion and followed by reflection from the opposite partition.

To be further described below, a structure (e.g., structure 100 shown in FIG. 1) in accordance with the present disclosure may address the some of the shortcomings of various digital radiography systems and film-screen radiography systems.

Figure 1:
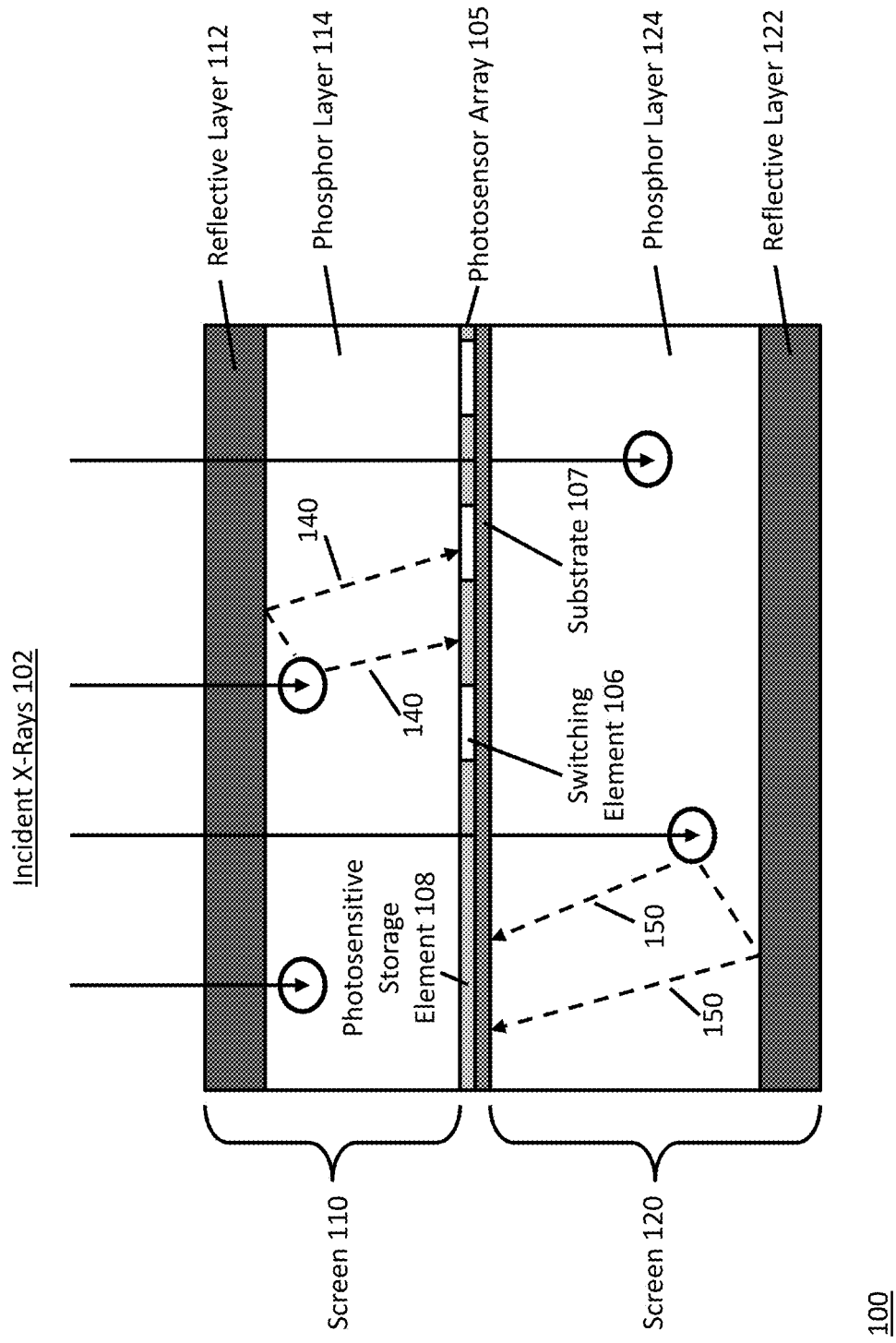
FIG. 1 illustrates an example structure that can be utilized to implement dual-screen digital radiography with asymmetric reflective screens in an aspect of the disclosure.

FIG. 1 illustrates an example structure 100 that can be utilized to implement dual-screen digital radiography with asymmetric reflective screens, arranged in accordance with at least some aspects described herein. The structure 100 may include a first screen 110, a second screen 120, a photosensor array 105, and substrate 107. The first screen 110 may be oriented such that a back side of the first screen faces incident radiation, such as incident X-rays 102, being directed towards the structure 100. The photosensor array 105 may be disposed between the first screen 110 and the second screen 120. The first screen 110 and the second screen 120 may be oriented in opposite directions, such that the first screen 110 and the second screen 120 faces each other. In the orientation of the structure 100 shown in FIG. 1, the back side of the first screen 110 may be a top surface of the structure 100 and a back side of the second screen 120 may be a bottom surface of the structure 100. A thickness of the first screen 110 may be less than a thickness of the second screen 120. The first screen 110 may be disposed above the photosensor array 105, such that incident x-rays 102 may be incident on the first screen 110.

Screen 110 may include a scintillating phosphor layer 114 and a reflective layer 112, where the reflective layer 112 may be made of a highly reflective material. Screen 120 may include a scintillating phosphor layer 124 and a reflective layer 122, where the reflective layer 122 may made of a highly reflective material. For example, the reflective layers 114, 124 may be coated with a layer of white material, such as titanium dioxide. The reflective layers 112, 122 may be of same or different size, and may be coated with same or different materials. Each of the phosphor layers 114, 124 may include phosphor crystals that may capture the incident x-rays 102 and convert the captured x-rays into light photons. In some examples, a thickness of the phosphor layer 114 may be less than a thickness of the phosphor layer 124, such that the screen 110 may be thinner than the screen 120. In some examples, the screens 110, 120 may each be granular type (e.g. GdO2S2:Tb), or columnar (e.g. CsI:TI) type. In some examples, an additional support for the thicker screen (e.g., screen 120) may optionally disposed below the reflective layer 122 for increased structural stability.

The photosensor array 105 may include photosensitive storage elements 108 and may include a plurality of switching elements 106. The substrate 107 may be of small optical thickness may be disposed between the photosensor array 105 and the phosphor layer 124. The photosensitive storage elements 108 and the switching elements 106 may be disposed on top of the substrate 107. The photosensor array 105 may be comprised of a-Si:H n-i-p photodiodes, MIS-type, or other types. The photosensor array 105 may be sensitive to light incident from either side, and may have a low transmittance at the wavelengths emitted by the screens 110, 120. For example, the photosensor array 105 may have high optical absorption (above 90%) at the wavelength of the light emitted by the screens 110, 120, such that pixel crosstalk and crossover effects may be reduced. In an example, the substrate 107 may be of thin glass, plastic, or cellulose with thickness less than 30 microns, and preferably less than 10 microns. The photosensor array 105 may capture the light photons and may convert the captured light photons into electrical signals, where the electrical signals may be used by a device (separate from the structure 100) to produce a digital image. For example, each switching element 106 may correspond to a pixel of an image, such that toggling particular columns, rows, groups of pixels may cause a read out of a group of pixel values to produce an image.

In an example, the structure 100 may be a component of an imaging system that produces images. In operation, the phosphor layer 114 may receive the incident x-rays 102 and convert the incident x-rays 102 into light. As the converted light reaches the photosensor array 105, the photosensor array 105 may capture the light photons from the converted light, and may convert the light photons to electrical signals. In an example shown in FIG. 1, when the incident X-rays 102 reaches the phosphor layer 114, the crystals in the phosphor layer 114 may convert the X-rays into photons 140. The photons 140 may scatter among the phosphor layer 114. Some of the scattered photons may be directed towards the photosensor array 105, while other scattered photons may be directed away from the photosensor array 105. The reflective layer 112 may reflect the scattered photons toward the photosensor array 105 in order for the photosensor array 105 to capture the scattered photons.

In some examples, the incident x-rays 102 may not be fully captured by the phosphor layer 114 (e.g., phosphor layer 114 may not have enough crystals to convert all incident x-rays). The uncaptured x-rays may pass through the photosensor array 105, and the crystals among the phosphor layer 124 of the second screen 120 may convert the captured x-rays into light photons 150. The photons 150 may scatter among the phosphor layer 124. Some of the scattered photons may be directed towards the photosensor array 105, while other scattered photons may be directed away from the photosensor array 105. The reflective layer 122 may reflect the scattered photons toward the photosensor array 105 in order for the photosensor array 105 to capture the scattered photons. Thus, the second screen 120 facilitates the photosensor array 105 to recapture photons that was not absorbed by the photosensor array 105 from the reflections of the screen 110.

In some examples, the light converted from the top screen 110 (facing the incident x-rays) may be weighted by adjusting the optical properties of the photosensor array 105. The light from the screen 110 may include more information from the low-energy part of the incident x-ray spectrum due to beam hardening effects, and emphasizing this may improve the visibility of low contrast objects in images generated by the imaging system utilizing the structure 100.

In an example, a process may be implemented by a computer device or hardware processor to construct the structure 100 may begin with executing a radiographic examination to determine a beam quality, or the half-value layer (HVL) of the phosphor layers 114, 124. Then, mathematical models may be used to determine performance measures such as signal-to-noise ratio (SNR), modulation transfer function (MTF), as a function of a ratio of coating weights or thicknesses of the two screens 110, 120. Then, based on the results from the radiographic examination and performance measures, a thickness ratio of the phosphor layers 114, 124 is selected that may provide an optimum performance in a desired implementation of the structure 100.

For example, the thicknesses of the two scintillating phosphor layers 114, 124 may be chosen to maximize a detective quantum efficiency (DQE) of an imaging system utilizing the structure 100. The DQE is the output signal-to-noise ratio (SNR) per input quantum, and the DQE depends on spatial frequency and x-ray exposure levels. A fundamental limit on DQE performance is given by the product of the x-ray absorption efficiency and two noise factors, one of which quantifies the variation in the magnitude of response to an absorption event (the Swank factor) and one quantifying the variation in spatial response to an event (the Lubberts factor). The Lubberts Factor describes the dropoff in DQE due to the variation in the spatial spreading of light arising from x-ray absorption events occurring at various distances from the photosensor array. In an example to maximize the detective quantum efficiency, the thinner (less thickness) of the two scintillating phosphor layers 114, 124 may be chosen to be between 30% and 45% of a sum of thicknesses of the two scintillating phosphor layers 114, 124.

In some examples, the thicknesses of the two scintillating phosphor layers 114, 124 may be chosen to maximize the MTF of an imaging system utilizing the structure 100. To maximize the MTF, the thinner of the two scintillating screens is chosen to be between 20% and 40% of the total scintillating layer thickness.

In an example, the structure 100 may be a component of an imaging system. The imaging system may include the structure 100, a processor, and a memory configured to be in communication with each other. The first screen 110 of the structure 100 may receive the incident X-rays 102, and may convert the incident X-rays into light photons. The reflective layer 114 may reflect the light photons scattered among the first phosphor layer 112 towards the photosensor array 105. The reflective layer 124 of the second screen 120 may reflect the light photons that passed through the photosensor array 105 back towards the photosensor array 105. The photosensor array 105 may convert captured photons into electrical signals, and may output the electrical signals to the processor. The processor may store the electrical signals in the memory, and may produce an image using the electrical signals.

In an example, the structure 100 may be a radiation detector among an apparatus comprising a X-ray source and a processor. The X-ray source may be a X-ray tube that produces X-rays, or other devices that may produce X-rays. A subject, such as an object, may be disposed between the X-ray source and the structure 100. The X-ray source may irradiate X-ray onto the subject, where the subject may absorb a portion of the X-rays, causing an attenuation of the X-rays. The attenuated X-rays may be directed towards the structure 100 as incident X-rays 102. The first screen 110 of the structure 100 may receive the incident X-rays 102, and may convert the incident X-rays into light photons. The reflective layer 114 may reflect the light photons scattered among the first phosphor layer 112 towards the photosensor array 105. The reflective layer 124 of the second screen 120 may reflect the light photons that passed through the photosensor array 105 back towards the photosensor array 105. The photosensor array 105 may capture the light photons and convert the captured light photons into electrical signals. The processor may be operable to receive the electrical signals from the radiation detector and produce an image of the subject using the electrical signals.

Figure 2:
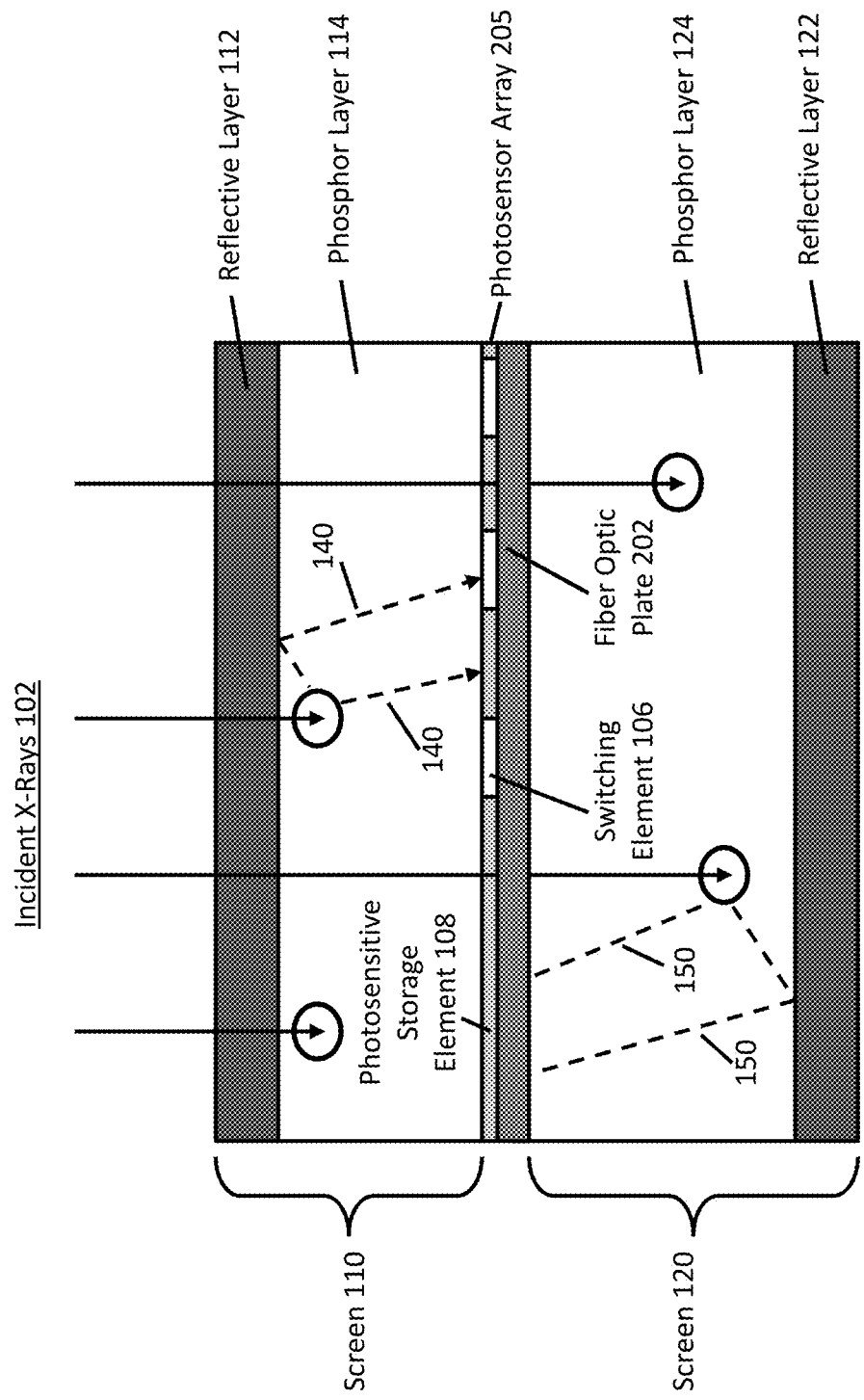
FIG. 2 illustrates an example structure that can be utilized to implement dual-screen digital radiography with asymmetric reflective screens in an aspect of the disclosure.

FIG. 2 illustrates an example structure 200 that can be utilized to implement dual-screen digital radiography with asymmetric reflective screens, arranged in accordance with at least some embodiments described herein. FIG. 2 may be described below with references to the above descriptions of FIG. 1.

The structure 200 may include the first screen 110, the second screen 120, a photosensor array 205, and a fiber optic plate 202. The photosensor array 205 may include the photosensitive storage elements 108, and may include the plurality of switching elements 106. The fiber optic plate 202 may be of essentially zero optical thickness, such as a negligible optical thickness and physical thickness of 1 to 3 mm. In some examples, the fiber numerical aperture of the fiber optic plate 202 may be relatively large.

Figure 3:
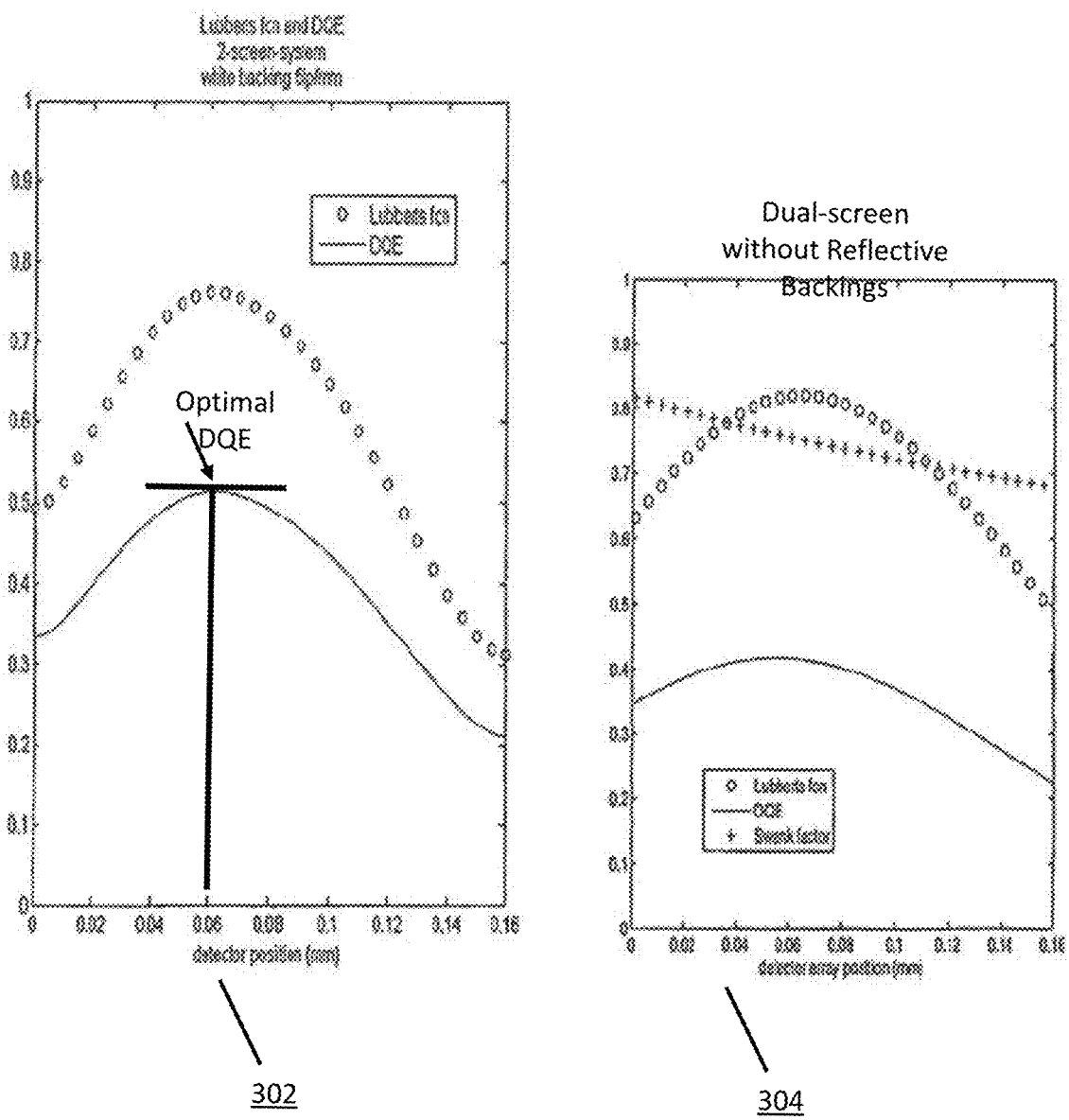
FIG. 3 illustrates example results of performance measures relating to dual-screen digital radiography with asymmetric reflective screens in an aspect of the disclosure.

FIG. 3 illustrates example results of performance measures relating to dual-screen digital radiography with asymmetric reflective screens, arranged in accordance with at least some embodiments described herein. FIG. 3 may be described below with references to the above descriptions of FIGS. 1-2.

A graph 302 indicating the Lubberts factor and DQE of an imaging system utilizing a dual-screen structure (e.g., structure 100, and/or 200) with white backings (reflective layers 112, 122), and a resolution of 5 lp/mm (line pairs per millimeter), is shown in FIG. 3. In the graph 302, a total thickness of the two screens in the dual-screen structure is 160 microns (0.160 mm), where the back side (the side including the reflective layer 112) of the thinner screen (first screen 110) is located at 0 microns, and the back side (the side including the reflective layer 114) of the thicker screen is located at 160 microns. As shown by graph 302, the optimal DQE point is at 0.06 mm, which means the optimal position of the photosensor array (e.g., photosensor arrays 105, 205 described above) relative to the total thickness is 0.06 mm (60 microns) away from the 0 micron point, or the back side of the thinner screen where the incident x-rays are being received. The ratio of the thicknesses of the two screens to maximize DQE, by having the photosensor array at 0.06 mm, is approximately 37%.

A graph 304 indicating the Lubberts factor, the DQE, and the swank factor of an imaging system utilizing a dual-screen structure (e.g., structure 100, 200, and/or 300) without reflective layers, is shown in FIG. 3. As shown by graph 304, the DQE is lower than the DQE indicated in graph 302, which means the inclusion of reflective layers would increase the DQE of the imaging system. The Lubberts Factor describes the drop-off in DQE due to the variation in the spatial spreading of light arising from x-ray absorption events occurring at various distances from the photosensor array.

Figure 4:
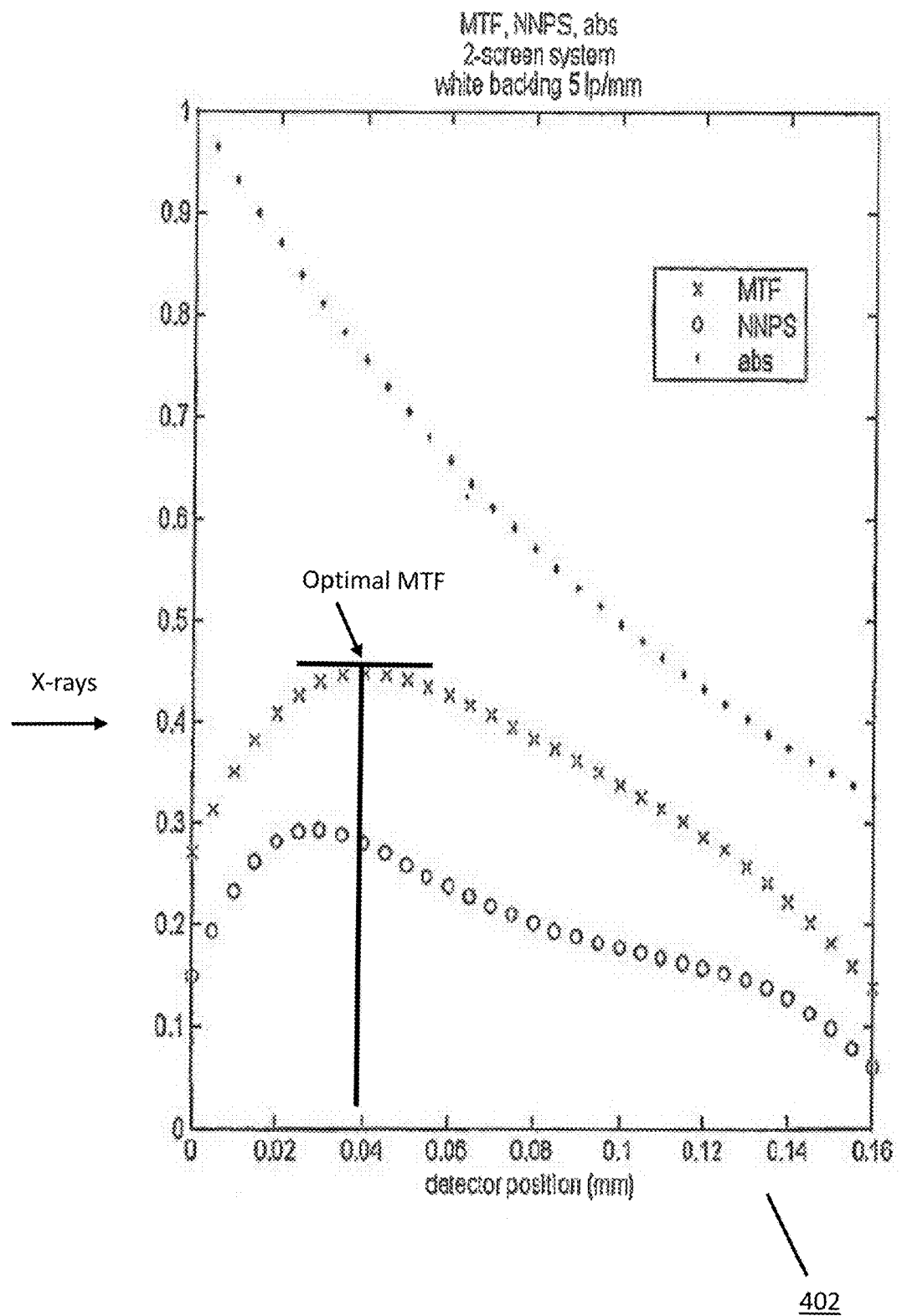
FIG. 4 illustrates example results of performance measures relating to dual-screen digital radiography with asymmetric reflective screens in an aspect of the disclosure.

FIG. 4 illustrates example results of performance measures relating to dual-screen digital radiography with asymmetric reflective screens, arranged in accordance with at least some embodiments described herein. FIG. 4 may be described below with references to the above descriptions of FIGS. 1-3.

A graph 402 shows the results of a number of calculations in which a single intensifying screen is subdivided into two parts of different relative thicknesses and sandwiched around the photosensor array at different positions shown on the x-axis of the graph 402. Similar to the example in FIG. 3, the dual-screen structure relating to graph 402 includes (e.g., structure 100 and/or 200) white backings (reflective layers 112, 122), and a resolution of 5 lp/mm (line pairs per millimeter). The total thickness of the two screens is 160 microns. A 70 kVp RQA5 incident x-ray beam is incident from the left. The MTF and normalized noise power spectrum (NNPS) are shown in graph 402 for each configuration. The optimal MTF point is at 0.04 mm, which means the optimal position of the photosensor array (e.g., photosensor arrays 105, 205 described above) relative to the total thickness is 0.04 mm (40 microns) away from the 0 micron point, or the back side of the thinner screen where the incident x-rays are being received. The ratio of the thicknesses of the two screens to maximize MTF, by having the photosensor array at 0.06 mm, is approximately 25%.

Figure 5:
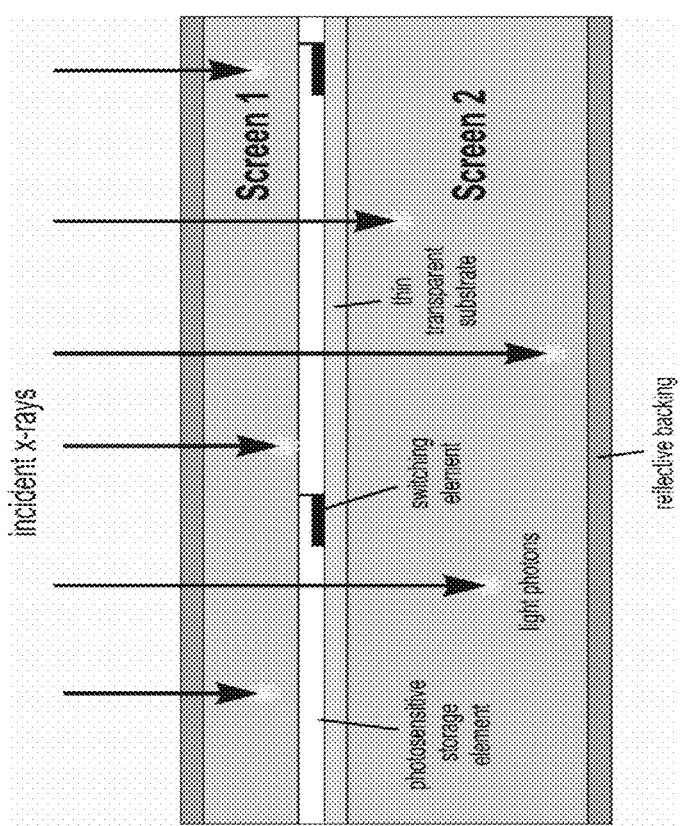
FIG. 5 illustrates a difference between a standard configuration of a x-ray detector and a dual-screen configuration as described in the present disclosure.
Figure 5:
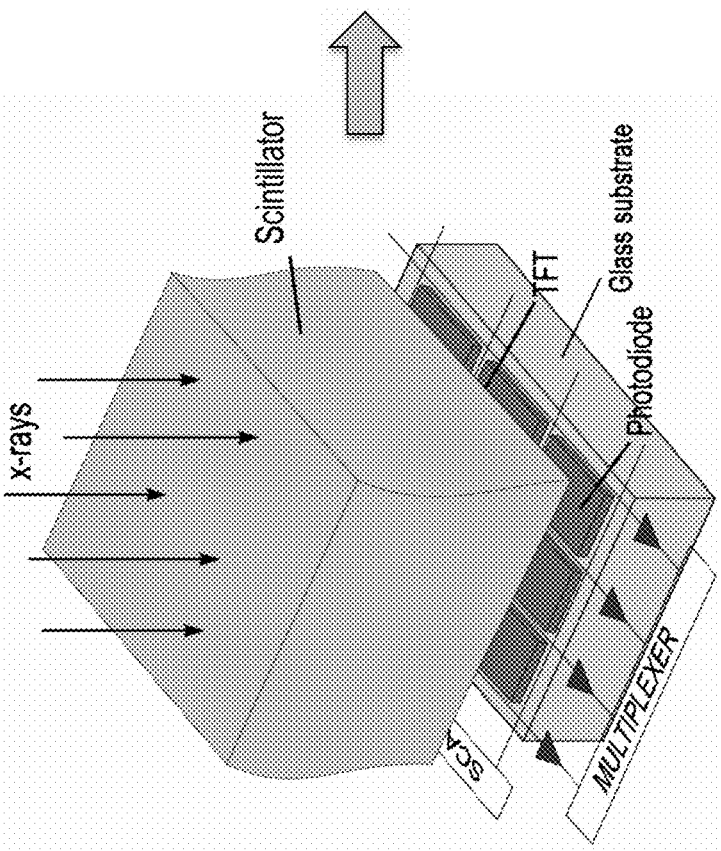

FIG. 5 illustrates a difference between a standard configuration of a x-ray detector and a dual-screen configuration as described in the present disclosure. As shown in FIG. 5, the standard configuration includes one scintillator, and the glass substrate is the bottom-most layer of the detector. The dual-screen configuration adds another screen ("Screen 2") that is thicker than the top screen ("Screen 1") underneath the glass substrate, and both top and bottom screens have respective reflective backing.

Figure 6:
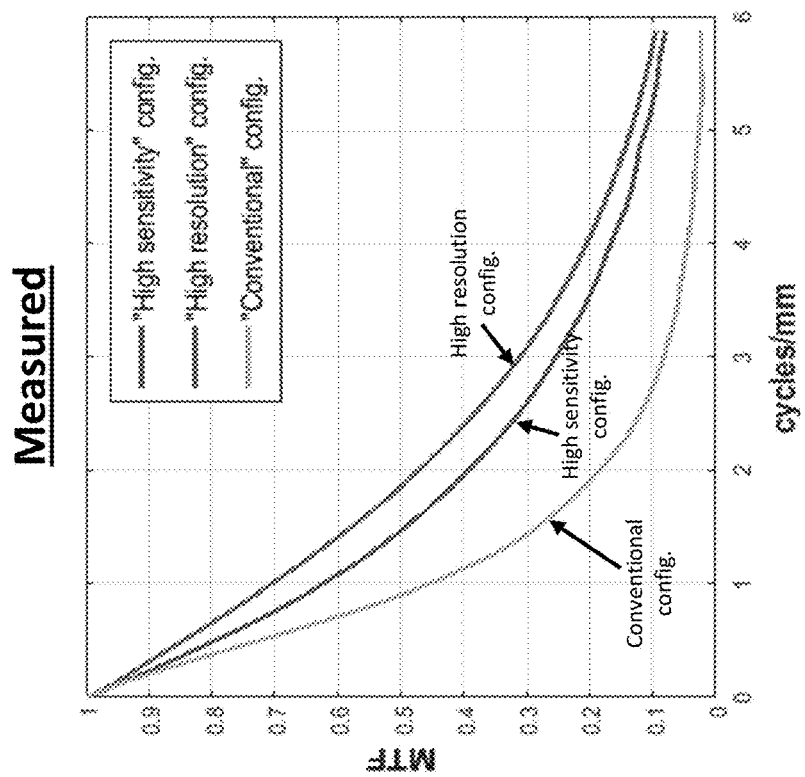
FIG. 6 illustrates experimental results indicating a difference in MTF between standard or conventional configuration with one screen and a dual-screen configuration as described in the present disclosure.
Figure 6:
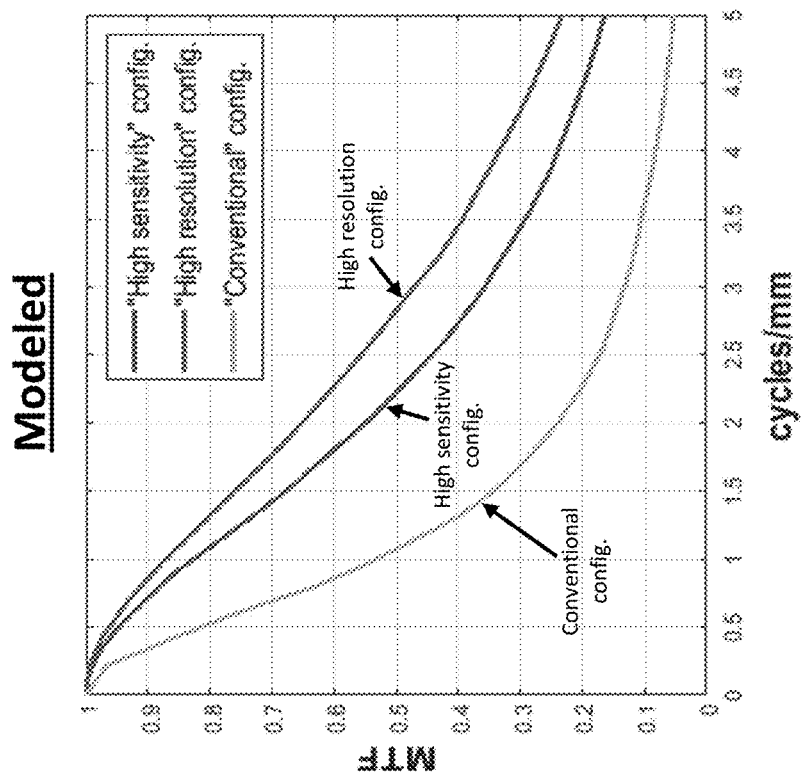

FIG. 6 illustrates experimental results indicating a difference in MTF between standard or conventional configuration with one screen and a dual-screen configuration as described in the present disclosure. As shown in FIG. 6, the modeled MTF of the dual-screen configuration, under both a high sensitivity configuration and a high resolution configuration, is greater than the modeled MTF of a conventional configuration. Also shown in FIG. 6, the measured MTF of the dual-screen configuration, under both a high sensitivity configuration and a high resolution configuration, is greater than the measured MTF of a conventional configuration.

Figure 7:
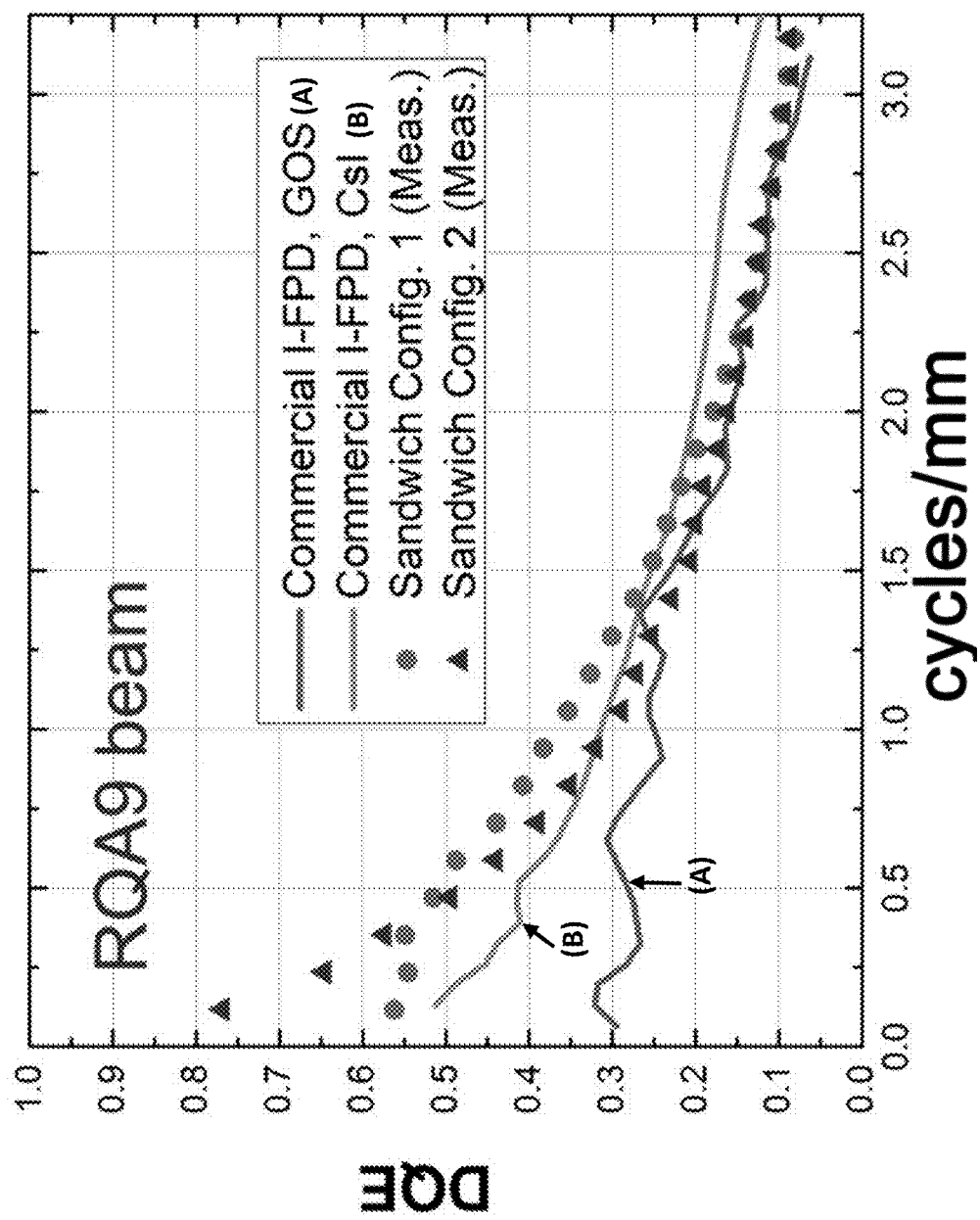
FIG. 7 illustrates experimental results indicating a difference in DQE between a standard configuration with one screen and a dual-screen configuration as described in the present disclosure.

FIG. 7 illustrates experimental results indicating a difference in DQE between a standard configuration with one screen and a dual-screen configuration as described in the present disclosure. The experimental results shown in FIG. 7 are based on an experiment using RQA9 incident x-ray beam. As shown in FIG. 7, the measured DQE of the dual-screen configuration is greater than the conventional configuration.

Figure 8:
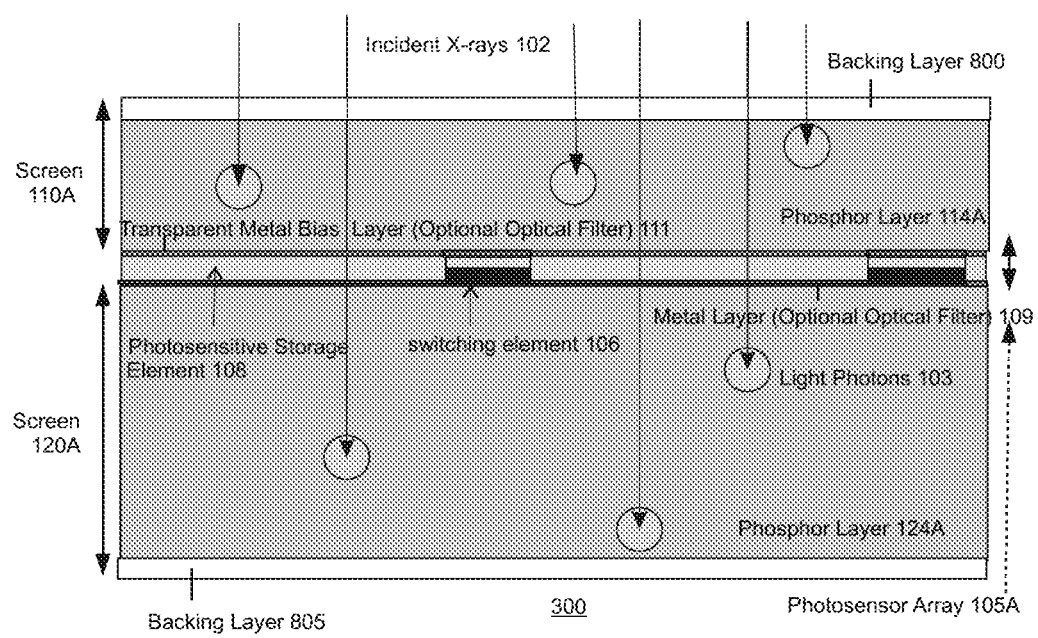
FIG. 8 illustrates an example structure that can be utilized to implement dual-screen digital radiography with asymmetric reflective screens in an aspect of the disclosure.

FIG. 8 depicts a structure 300 in accordance with aspects of the disclosure. The structure 300 is substrateless. In other words, there is no substrate in the structure 300 between the screen 120A and photosensor array 105A and screen 110A and photosensor array 105A.

The front screen 110A may comprise a scintillating phosphor layer or material 114A. For example, the front screen 110A may include phosphor crystals that may capture the incident x-rays 102 and convert the captured x-rays into light photons 103. In some examples, the phosphor layer 114A may be a powder or granular type (e.g., GdO2S2:Tb, CaWO4, BaFCl:Eu). In other examples, the screen phosphor may be comprised of nanometer-sized particles such as quantum dots, rather than the micron sized particles typical of "standard" screens such as GdO2S2:Tb. In still other examples, the scintillating material may be of the perovskite type. The front screen 110A may emit light photons (e.g., photon bursts) in the visual light region.

In other aspects of the disclosure, the front screen 110A may comprise a structured scintillating layer. For example, the front screen 110A may include scintillating phosphor needle structures that may capture the incident x-rays 102 and convert the captured x-rays into light photons 103. In some examples, the front screen 10 may be a vacuum deposited needle structure composed of CsI:Tl. Where CsI:Tl is used, the front screen 10 may emit light in about 550 nm region. In other aspects of the disclosure, a liquid scintillating material may be used. In some examples, a combination of different types of scintillating materials may be used.

Similarly, the back screen 120A may comprise a scintillating phosphor layer or material 124A. For example, the back screen 120A may include phosphor crystals that may capture the light photons 103. In some examples, the phosphor layer 124A may be a powder or granular type (e.g., GdO2S2:Tb, CaWO4, BaFCl:Eu). In other examples, the screen phosphor may be comprised of nanometer-sized particles such as quantum dots, rather than the micron sized particles typical of "standard" screens such as GdO2S2:Tb. In still other examples, the scintillating material may be of the perovskite type. The back screen 120A may emit light photons (e.g., photon bursts) in the visual light region.

In other aspects of the disclosure, the back screen 120A may comprise a structured scintillating layer. For example, the back screen 120A may include scintillating phosphor needle structures that may capture the light photons 103. In some examples, the back screen 120A may be a vacuum deposited needle structure composed of CsI:Tl. In some examples, a combination of different types of scintillating materials and types may be used for the front and back screens. For example, the front screen 110A may be a powder or granular type whereas, the back screen 120A may have needle structures. Preferably, in this aspect of the disclosure, there is no substrate between the photosensor array 105A and the screen 120A (in use).

U.S. Pat. No. 7,569,832 proposes an imaging device employing two scintillating screens sandwiched around a transparent substrate on which is deposited an imaging array of pixels. However, the substrate layer gives rise to a loss of sharpness due to light spreading within the substrate and other deleterious light piping effects. Additionally, U.S. Pat. No. 7,745,798 proposes a device using two scintillating screens sandwiched around a photodetector layer in which the screens have high optical scattering, the photodetector comprises a photoconductive layer, and where the photodetector layer and its support have been thinned to 40 microns or less. Although this reduces the negative effects of the substrate, it does not eliminate them, and further the x-ray scintillating and light conversion layers are limited to optically turbid materials and photoconducting materials, respectively In the structure 300 there is no substrate, which removed a source of a loss of sharpness due to light spreading within the substrate between the screen and the photosensor array and other deleterious light piping effects. Additionally, more light photons from the screen 120A will reach the photosensor array, due to the elimination of any absorption in a separate substrate layer.

The incident x-rays 102 may not be fully captured by the front screen 110A (scintillating front screen) because the material may not have enough crystals to convert all of the incident x-rays. The uncaptured (and not converted) x-rays may pass through the front screen 110A and the photosensor array 105A and reach the screen 120A. Thus, the scintillator 124A facilitates the photosensor array 105A to capture extra photons from the x-rays that would not or could not be converted by the front screen 110A.

In an aspect of the disclosure, the screens 110A, 120A may have different thicknesses, e.g., phosphors 114A and 124A having different thickness. As shown in FIG. 8, the back screen 120A (phosphor 124A) is thicker than the front screen 110A (phosphor 114A). This is to allow the thinner front screen 110A to capture fine details in the incoming spatial pattern of x-rays, while the thicker back screen 120A compensates for the fact that some of the incoming x-ray flux is then not captured by the front screen 110A. Thus, the thickness of each phosphor 114A and 124A may be determined based on certain performance needs, which include signal-to-noise ratio and may be based on a particular application that the structure 300 is used for.

Figure 12:
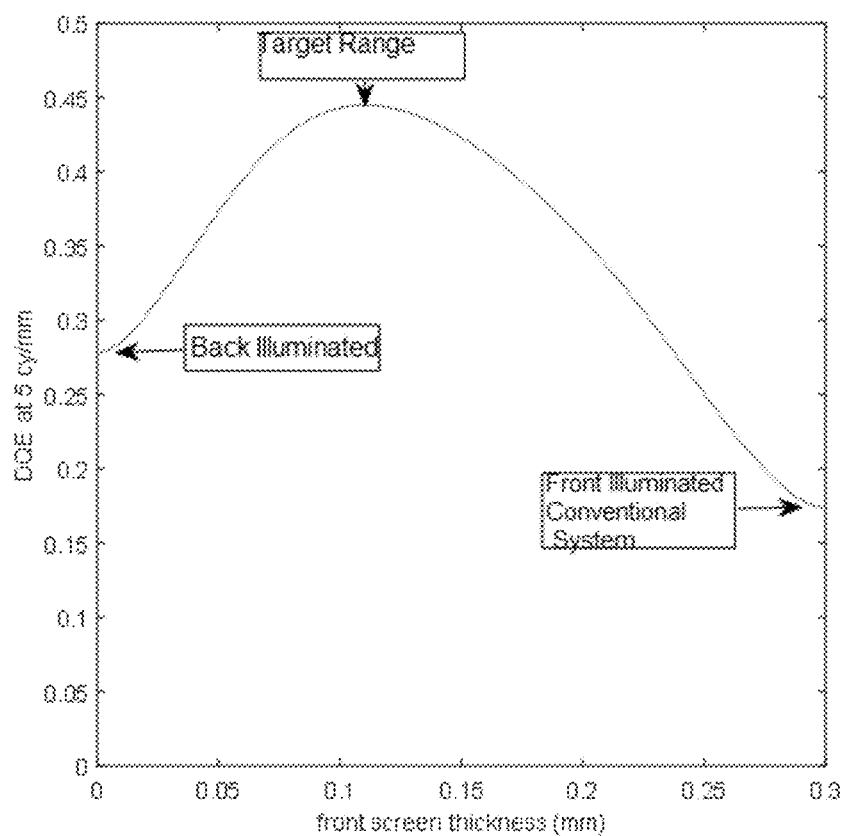
FIG. 12 illustrates the co-optimization of a dual-screen system to maximize DQE.

The thicknesses of the two scintillating phosphor layers 114A, 124A may be chosen to maximize a detective quantum efficiency (DQE) (as shown in FIG. 12) of an imaging system utilizing the structure 300. The DQE is the output signal-to-noise ratio (SNR) per input quantum, and the DQE depends on spatial frequency and x-ray exposure levels. In an example to maximize the detective quantum efficiency, the thinner of the two scintillating phosphor layers 114A may be chosen to be between about 25% and about 45% of a sum of thicknesses of the two scintillating phosphor layers 114A, 124A (e.g., near the peak of the curve in FIG. 12).

Figure 11:
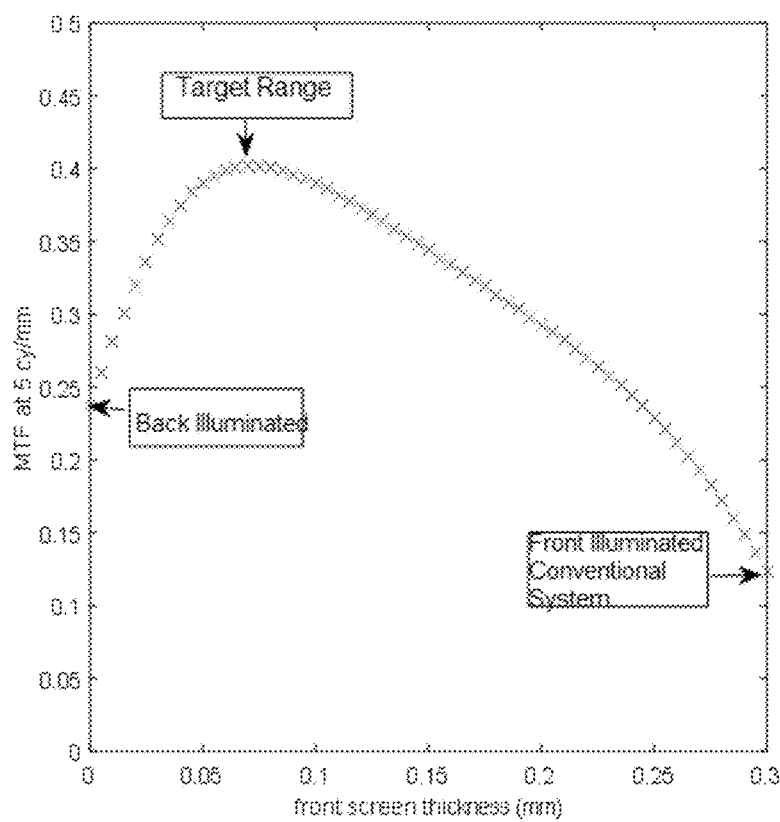
FIG. 11 illustrates the co-optimization of a dual-screen system to maximize MTF.

In other aspects, the thicknesses of the two scintillating phosphor layers 114A. 124A may be chosen to maximize the MTF of an imaging system utilizing the structure 300. To maximize the MTF, the thinner of the two scintillating screens is chosen to be between 20% and 40% of the total scintillating layer thickness (as shown in FIG. 11) (e.g., near the peak of the curve in FIG. 11).

In other aspects, the thicknesses of the two scintillating phosphor layers 114A. 124A may be chosen to optimize both the MTF and DQE.

The screens 110A, 120A may have a backing, e.g., backing layers 800, 805. The backing layers 800, 805 may serve multiple purposes. For example, the backing layers 800, 805 may provide support for the scintillation portion of the 110A, 120A. The thickness of the layer 800, 805 may be based on a specific application. Additionally, the backing layers 800, 805 may have optical characteristic(s) for the wavelength of the light photons created in the screens 110A, 1120A. For example, the backing layers 800, 805 may be absorptive for the light photons or reflective of the light photons. The optical characteristic of the backing layers 800, 805 may be determined based on the application for the structure 300 and desired performance requirements The front screen 110A may be oriented such that a backing layer 800 of the screen 110A faces incident radiation, such as incident X-rays 102, being directed towards the structure 300. The front screen 110A and the back screen 800 may be oriented in opposite directions, such that the phosphor 114A and the phosphor 124A face each other. In the orientation of the structure 300 shown in FIG. 8, the backing side (e.g., 800) of the front screen 110A may be a top surface of the structure 300 and the backing side (e.g., 805) of the second screen 120A may be a bottom surface of the structure 300.

The backing layer(s) 800, 805 may be made of a polymeric material such as polyester. The diffuse optical reflectance of the backing layer may be very high (above 90%) to maximize imaging signal-to-noise ratio, or low (below 10%) if the objective is to maximize imaging spatial resolution.

In an aspect of the disclosure, the material used for the backing layer(s) 800, 805 may also depend on the type of scintillating material used for the screens 110A, 120A. For example, an amorphous carbon or aluminum layer or a fiber optic may be used as the backing for a CsI:Tl screen. Other types of materials may be used for screens made from powders or granular. For example, the backing layer(s) 800, 805 may be made of a polymeric material such as polyester or PET (polyethylene terephthalate) for a powder screen.

Figures 9A, 9B:
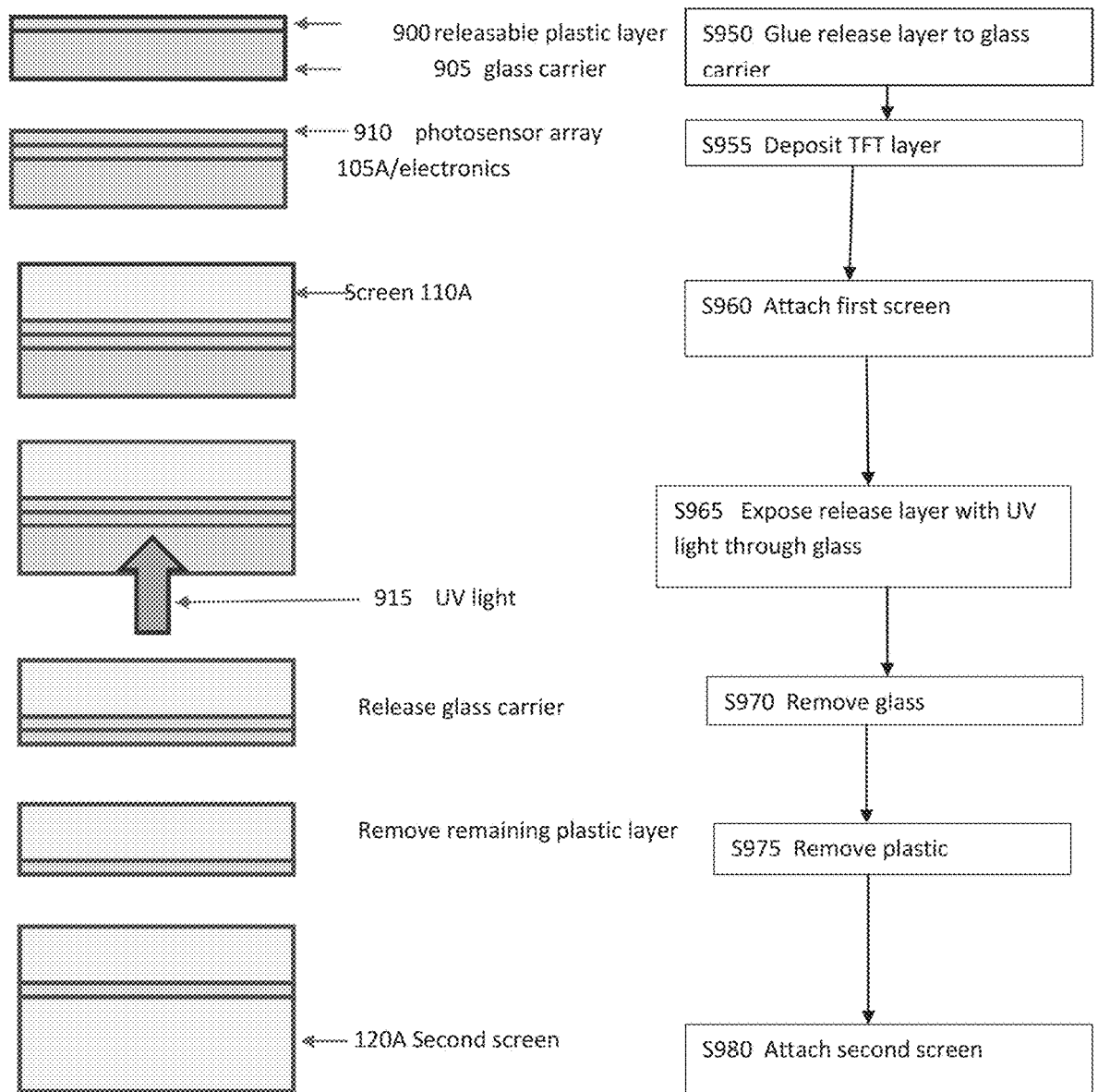
FIGS. 9A and 9B illustrate an example of a method of fabricating the example structure depicted in FIG. 8.

FIGS. 9A-9B illustrate a method of producing the dual screen structure 300 in accordance with aspects of the disclosure.

In S950, a thin flexible plastic sheet 900 may be glued to a carrier glass layer 905. The carrier glass 905 may be a standard substrate glass, available from Corning Glass®, and may be 0.7-1.0 mm thick. The plastic sheet (releasable plastic layer) 900 may be a PET film, available from Dupont®. The glue may be a UV-sensitive type whose adhesion is reduced UV light exposure, to allow release of the glass carrier layer 905.

At S955, a TFT layer may be deposited on the glass carrier/plastic layer 900/905. The TFT includes the photosensor array 105A and associated electronics including drive lines and data lines (collectively 910 in FIG. 9). For example, photolithographic patterning of various layers of amorphous silicon and other materials may be used.

At S960, the screen 110A may be attached to the TFT layer. In an aspect, an optical adhesive may be used. The adhesive may be a gel or a resin. In other aspects, the TFT layer may be thermally bonded or pressure fit (an example of direct contact).

At S965, the releasable plastic layer 900 may be exposed to an ultraviolet (UV) light (915), via the carrier glass layer 905. This is done to remove the plastic layer 900. At S970, the glass carrier layer 905 is removed from the structure after having reduced the adhesion of the UV-sensitive glue. In S975 any remaining thin plastic film 900 is removed from the structure by chemical treatment or mechanical polishing, or a combination of the two processes. In S980, the second screen 120A, is attached to the photosensor layer 105A by, for example, an optical adhesive as described above. In other aspects, the TFT layer may be thermally bonded or pressure fit to screen 120A (an example of direct contact).

While FIG. 9 does not explicitly describe the backing layers 800, 805, the backing layers may be attached to the other side(s) on the respective phosphor layers, 114A, 124A.

In other aspects of the disclosure, the photosensor array 105A may be directly deposited on the screen 120A by an ink jet printing means, which are known (another example of a direct contact).

In an aspect of the disclosure, the photosensor array 105A may include a plurality of bidirectionally photosensitive storage elements 108 and switching elements 106. The photosensitive storage elements 108 may be a-Si:H photodiodes, MIS-type sensors, or other sensor types known in the art. The switching elements 106 may be thin film transistor (TFT) elements of the a-Si:H type, metal oxide (MOTFT) types, or other types known in the art. The photosensor array 105A further may include a metal bias layer 111 which is transparent at the wavelengths emitted by the phosphor layer 114A, and which may be used to apply a reverse bias voltage to the array of photosensitive elements 108, and which may comprise an indium tin oxide (ITO) layer.

In some aspects, the metal bias layer 111 and metal bottom layer 109 (patterned layer) may be colored in the areas above and below the switching element 106 with a material which absorbs the light from the top and bottom scintillators, in order to prevent photoconductive action in the a-Si:H material of the TFT switch 106 (switching elements).

In other aspects of the disclosure one or more of the layers 111, 109 may have optical filter(s) for the wavelengths emitted by the phosphor layers 114A, 124A, respectively. Some amount of optical absorption in layer(s) 111 or 109 may be desirable in order to achieve the best signal-to-noise and object detection performance in the dual-screen system, which is achieved when the contribution to the net signal is the same regardless of whether the initial x-ray absorption event is the screen 110A or in the screen 120A. Otherwise, if the response to an individual x-ray ("gain") varies according to the location of the absorption event, a source of fluctuation or noise is introduced which degrades performance. Gain variation could arise due to variation in the properties of the two screens, or because of difference in the sensitivity of the bidirectional photosensor with incident light direction. Surprisingly, it is advantageous to reduce the signal for the higher of the two responses, in order to "balance", or equalize the gains. This can be achieved by the addition of an optical filter layer to the transparent metal layer 109 (or layer 111 depending on the application).

In some aspects of the disclosure, an addition of a small amount of absorbing material, such as a layer of a filter may be incorporated in the layer(s) 111 and/or 109. In other aspects, absorbing material may be dispersed in the layer(s) 111 and/or 109. In an aspect of the disclosure, the type of absorbing material may be based on the optical proprieties of the scintillating material used for the phosphor layers 114A/124A. For example, the material may be selected to match the wavelength of the emitted light. In an aspect of the disclosure, the optical filter may have an optical density between about 0.0 and about. 0.3. For example, an optical density of about 0.0 corresponds to little or no attenuation where as an optical density of 0.3 corresponds to an attenuation of about 50%.

FIGS. 11 and 12 show results of a series of calculations of various screen systems which two screen layers of different relative thicknesses are sandwiched around a photosensor layer, as a function of the front screen thickness. The calculations assume no substrate between the screens and the photosensor array or FOP and the photosensor array. The total thickness of phosphor(s) (front plus back) is 0.3 mm in all cases. For purpose of the calculations in FIGS. 11 and 12, the screens have a reflective (white) backing for the optical properties but the backings was assumed to have no thickness. Thus, the phosphor thickness was assumed to equal the respective screen thickness. The linear x-ray attenuation coefficient is 3.33/mm. For the purposes of the calculations, the performance parameters are evaluated at 5 cycles/mm. Under these conditions the total x-ray absorption and the zero-frequency DQE(0) will be the same for all configurations, but the higher-frequency MTF will vary, as indicated by the calculated MTF(5 cycles/mm). A zero front screen (screen 110A) corresponds to a back illuminated single screen and a 0.3 mm thickness corresponds to a front illuminated single screen. FIG. 11 suggests that when an application is designed to target a high modulation transfer function (MTF) (spatial resolution performance), the front screen (screen 110A) should have a thickness to achieve a peak in the MTF. In FIG. 11, the peak is where a ratio of front thickness to total phosphor thickness is about 0.25. For example, a ratio of the thickness may be between about 0.2 to about 0.4. In some aspects, the thickness ratio which maximizes MTF is with the phosphor layer 114A being about 25% of the total phosphor layers 114A, 124A thickness. The exact value of the optimal MTF-maximizing thickness ratio is found to depend on the energy of the incident x-ray beam, with higher energies requiring a higher ratio, and lower energies requiring a lower ratio. For example, for portal imaging, the structure(s) may have phosphor layers in each screen have the same thickness, e.g., ratio of 0.5 (50%) whereas, for mammography, the ratio would be much less because the energy is lower. For example, the ratio may be 0.25 (25%).

Similarly, FIG. 12 suggests that when an application is designed to target a higher signal-to noise, the phosphor layer 114A should have a thickness to achieve about a peak in the DQE. In FIG. 12, the peak is where a ratio of front thickness to total phosphor thickness is about 0.37. Here the detective quantum efficiency (DQE) is used as a performance measure. The DQE is a measure of imaging signal-to-noise performance per input x-ray, and is commonly accepted in the art for comparing the dose and imaging performance of different systems. For example, a ratio of the thickness may be between about 0.25 to about 0.45. The thickness ratio which maximizes DQE is where the phosphor layer 114A is about 37% of the total thickness. The exact value of the optimal DQE-maximizing thickness ratio is found to depend on the energy of the incident x-ray beam, with higher energies requiring a higher ratio, and lower energies requiring a lower ratio.

Figure 10:
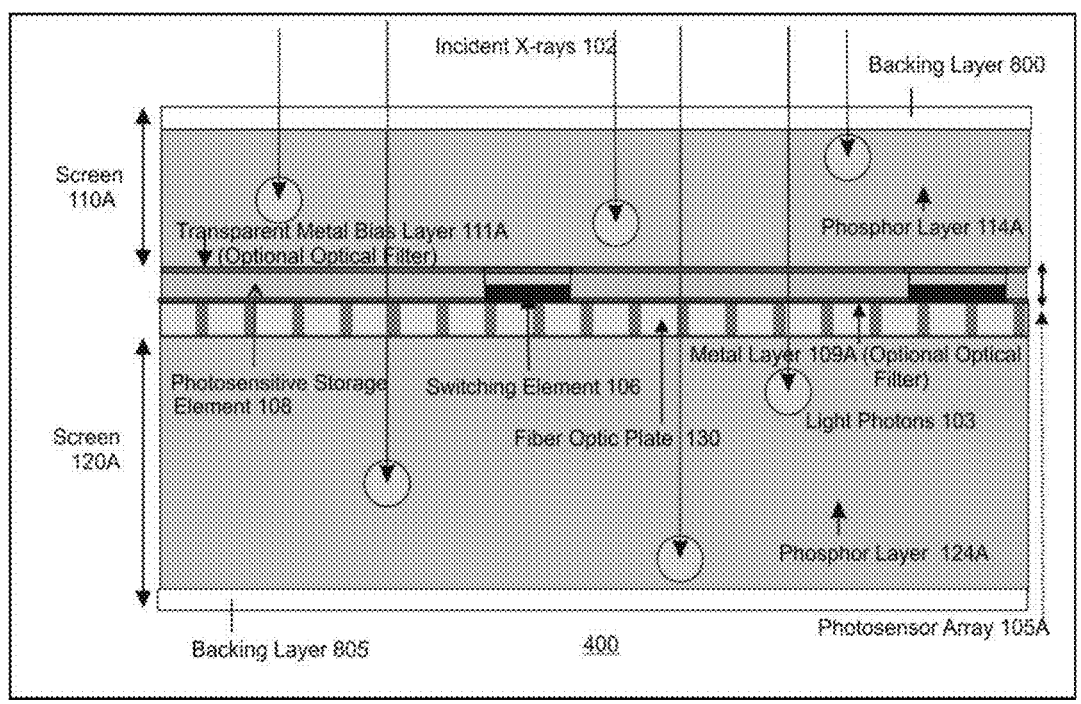
FIG. 10 illustrates an example structure that can be utilized to implement dual-screen digital radiography with asymmetric reflective screens in an aspect of the disclosure.

FIG. 10 illustrates an example of a structure 400 in accordance with aspects of the disclosure. The structure 400 in FIG. 10 further comprises a fiber optic plate (FOP) 130 between the photosensor 105A and screen 120A. The FOP 130 relays the spatial pattern of photons emerging from the screen 120A to the photosensor layer 105A. Since the FOP 130 may not be ideal, there may be a small amount of optical spreading or light loss. To maximize the light collected from the screen 120A, a FOP 130 with high numerical aperture (at or near unity) may be used.

An advantage of the structure 400 is the fact that the screen 120A and the FOP 130 may be purchased together, as a single unit. Such devices are referred to a "Fiber Optic Scintillators" (FOS), and are available commercially from, for example, Hamamatsu Photonics, Inc.

Another advantage of the structure 400 is that the top surface of the FOP 130 may be optically flat, and can serve as the substrate for the deposition of the various layers of the photosensor array 105A, before bonding of the screen 110A, to produce an asymmetric optimized structure. It is advantageous to place the FOP 130 between the screen 120A and the photosensitive layer 105A rather than between the screen 110A and the photosensitive layer 105A because light spreading in the FOP will have a more significant effect on the signal from the thinner, screen 110A.

As described above, the metal layer 109A (2D patterned layer) may have an optical filter. In this aspect, since an FOP 130 is between the screen 120A and the photosensor array 105A, the metal layer 109A may have a different optical filter. In other words, the optical density may be different due to the light loss in the FOP 130. In other aspects, the transparent metal bias layer 111A may also or alternately have the optical filter. The optical density may be different from above due to the use of the FOP 130 as well.

The structures 300, 400 may also be used in the image system as described above.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A structure comprising:
    a first scintillating screen that converts an absorbed portion of incident radiation directed at the structure into light photons;
    a photosensor array comprising a first metal layer and a second metal layer; and
    a second scintillating screen, the photosensor array being between the first scintillating screen and the second scintillating screen, the second scintillating screen converts an absorbed portion of the incident radiation transmitted through the first scintillating screen and the photosensor array into light photons, where a surface of the first scintillating screen faces the photosensor array and a surface of the second scintillating screen faces the photosensor array,
    wherein the photosensor array is operable to capture at least a portion of the light photons from the first scintillating screen and the second scintillating screen and convert the captured light photons into electrical signals,
    wherein the first metal layer directly contacts the first scintillating screen or is directly attached to the first scintillating screen using an optical adhesive;

wherein the second metal layer directly contacts the second scintillating screen or is directly attached to the second scintillating screen using an optical adhesive, and wherein the first metal layer or the second metal layer comprises an optical filter configured to attenuate layer output from the first scintillating screen or the second scintillating screen to balance gain between the first scintillating screen and the second scintillating screen.

2. The structure of claim 1, wherein the photosensor array comprises a plurality of bidirectionally photosensitive storage elements for capturing the at least a portion of the light photons from the first scintillating screen and the second scintillating screen, and a plurality of switching elements, where one switching element of the plurality of switching elements corresponds to one of the plurality of bidirectionally photosensitive storage elements, respectively, wherein the first metal layer is a transparent metal bias layer and the second metal layer is a transparent 2D patterned metal layer, where the transparent 2D patterned metal layer directly contacts or is directly attached to the second scintillating screen.

3. The structure of claim 1, wherein the first scintillating screen comprises a scintillating structure having a first thickness, and the second scintillating screen comprises a scintillating structure having a second thickness, where the second thickness is greater than the first thickness.

4. The structure of claim 1, wherein the second scintillating screen further comprises a backing, the backing contacting a surface of the scintillating screen opposite of a surface facing the photosensor array.

5. The structure of claim 1, wherein the first scintillating screen and the second scintillating screen are formed of a different type, the type being granular or columnar.

6. The structure of claim 2, wherein portions of the transparent metal bias layer are not transparent, the portions being aligned with the plurality of switching elements as viewed from the transparent metal bias layer to the transparent 2D patterned metal layer.

7. The structure of claim 6, wherein the portions are colored.

8. The structure of claim 3, wherein a ratio of the first thickness to a combination of the first thickness and the second thickness is based on an incoming x-ray beam energy.

9. The structure of claim 3, wherein a ratio of the first thickness to a combination of the first thickness and the second thickness is based on a target spatial resolution performance.

10. The structure of claim 9, wherein the ratio is between about 0.2 and about 0.4.

11. The structure of claim 3, wherein a ratio of the first thickness to a combination of the first thickness and the second thickness is based on a target detective quantum efficiency.

12. The structure of claim 11, wherein the ratio is between about 0.25 and about 0.45.

13. The structure of claim 1, wherein the second metal layer is a transparent 2D patterned metal layer and the transparent 2D patterned metal layer comprises the optical filter configured to attenuate light output from the second scintillating screen to balance gain from the second scintillating screen with the first scintillating screen.

14. The structure of claim 1, wherein the first metal layer is a transparent metal layer and the transparent metal layer comprises the optical filter configured to attenuate light output from the first scintillating screen to balance gain from the first scintillating screen with the second scintillating screen.

15. The structure of claim 13, wherein the optical filter comprising a layer of absorbing material.

16. The structure of claim 13, wherein the optical filter has an optical density between 0.0 and 0.3.

17. The structure of claim 4, wherein the first scintillating screen further comprises a backing, the backing of the first scintillating screen facing an incoming x-ray beam energy.

18. An imaging system comprising:
a processor configured to be in communication with a structure comprising:
a first scintillating screen that converts an absorbed portion of incident radiation directed at the structure into light photons;
a photosensor array comprising a first metal layer and a second metal layer; and
a second scintillating screen, the photosensor array being between the first scintillating screen and the second scintillating screen, the second scintillating screen converts an absorbed portion of the incident radiation transmitted through the first scintillating screen and the photosensor array into light photons, where a surface of the first scintillating screen faces the photosensor array and a surface of the second scintillating screen faces the photosensor array,
wherein the photosensor array is operable to capture at least a portion of the light photons from the first scintillating screen and the second scintillating screen and convert the captured light photons into electrical signals, each electrical signal representing the captured light photons from both the first scintillating screen and the second scintillating screen,
wherein the first metal layer directly contacts the first scintillating screen or is directly attached to the first scintillating screen using an optical adhesive; and
wherein the second metal layer directly contacts the second scintillating screen or is directly attached to the second scintillating screen using an optical adhesive, and
wherein the first metal layer or the second metal layer comprises an optical filter configured to attenuate layer output from the first scintillating screen or the second scintillating screen to balance gain between the first scintillating screen and the second scintillating screen,
the processor is configured to:
receive the electrical signals from the structure; and
produce an image having a plurality of pixels using the electrical signals.

19. An imaging system comprising:
a processor configured to be in communication with a structure comprising:
a first scintillating screen that converts an absorbed portion of incident radiation directed at the structure into light photons;
a photosensor array comprising a first metal layer and a second metal layer; and
a second scintillating screen, the photosensor array being between the first scintillating screen and the second scintillating screen, the second scintillating screen converts an absorbed portion of the incident radiation transmitted through the first scintillating screen and the photosensor array into light photons, where a surface of the first scintillating screen faces the photosensor array and a surface of the second scintillating screen faces the photosensor array, wherein the photosensor array is operable to capture at least a portion of the light photons from the first scintillating screen and the second scintillating screen and convert the captured light photons into electrical signals, each electrical signal representing the captured light photons from both the first scintillating screen and the second scintillating screen, wherein the first metal layer directly contacts the first scintillating screen or is directly attached to the first scintillating screen using an optical adhesive; and wherein the second metal layer directly contacts the second scintillating screen or is directly attached to the second scintillating screen using an optical adhesive, the processor is configured to:
receive the electrical signals from the structure; and
produce an image having a plurality of pixels using the electrical signals, wherein the photosensor array comprises a plurality of bidirectionally photosensitive storage elements for capturing the at least a portion of the light photons from the first scintillating screen and the second scintillating screen, and a plurality of switching elements, where one switching element of the plurality of switching elements corresponds to one of the plurality of bidirectionally photosensitive storage elements, respectively, and wherein the first metal layer is a transparent metal bias layer and the second metal layer is a transparent 2D patterned metal layer, where the transparent 2D patterned metal layer faces the second scintillating screen, wherein the processor controls each row of switching elements using a scanning control unit, thereby connecting the corresponding bidirectionally photosensitive storage elements to amplifiers, whose outputs are digitized to pixel values for each row of the image.

20. A radiation detector comprising:
a first radiation converter;
a second radiation converter; and
a photosensor array between the first radiation converter and the second radiation converter, the photosensor array comprising a first metal layer and a second metal layer, the first metal layer being directly in contact with the first radiation converter or being directly attached to the first radiation converter using an optical adhesive and the second metal layer being directly in contact with the second radiation converter or being directly attached to the second radiation converter using an optical adhesive, wherein the first metal layer or the second metal layer comprises an optical filter configured to attenuate layer output from the first radiation converter or the second radiation converter to balance gain between the first radiation converter and the second radiation converter, the first radiation converter being configured to:
receive and partially absorb incident radiation directed towards the radiation detector; and
convert the absorbed incident radiation into a burst of a plurality of light photons, a number of which reach the photosensor array and are detected;

the second radiation converter being configured to:
receive and partially absorb a portion of the incident radiation transmitted through the first radiation converter and the photosensor array; and
convert the absorbed radiation into a burst of a plurality of light photons, a number of which reach the photosensor array and are detected, the photosensor array being configured to:
respond to a spatial pattern of the light photons from the first radiation converter and the second radiation converter by converting the light photons into an electrical signal pattern representative of a sum of the spatial pattern of the light photons from the first radiation converter and the spatial pattern of the light photons from the second radiation converter.

* * * * *